(12) United States Patent
Bravo et al.

(10) Patent No.: US 10,524,394 B2
(45) Date of Patent: Dec. 31, 2019

(54) 4-POST RACK WITH INTEGRATED INTAKE/EXHAUST REGIONS

(71) Applicant: Panduit Corp., Tinley Park, IL (US)

(72) Inventors: Rey Bravo, Manhattan, IL (US); Nathan A. Gleghorn, Chicago, IL (US)

(73) Assignee: Panduit Corp., Tinley Park, IL (US)

( * ) Notice: Subject to any disclaimer, the term of this patent is extended or adjusted under 35 U.S.C. 154(b) by 254 days.

(21) Appl. No.: 15/589,437

(22) Filed: May 8, 2017

(65) Prior Publication Data
US 2018/0324983 A1 Nov. 8, 2018

(51) Int. Cl.
*H05K 7/20* (2006.01)
*H05K 7/14* (2006.01)

(52) U.S. Cl.
CPC ....... *H05K 7/20572* (2013.01); *H05K 7/1489* (2013.01); *H05K 7/20145* (2013.01)

(58) Field of Classification Search
CPC ............ H05K 7/20572; H05K 7/1489; H05K 7/20145; H05K 7/20736; H05K 7/20618; H05K 7/2059; H05K 7/20581
See application file for complete search history.

(56) References Cited

U.S. PATENT DOCUMENTS

| | | | |
|---|---|---|---|
| 6,305,180 B1 * | 10/2001 | Miller | H05K 7/20572 165/104.33 |
| 6,717,807 B2 | 4/2004 | Hikawa | |
| 7,033,267 B2 | 4/2006 | Rasmussen | |
| 7,112,131 B2 | 9/2006 | Rasmussen et al. | |
| 7,182,208 B2 | 2/2007 | Tachibaba | |
| 7,319,594 B2 | 1/2008 | Nicolai et al. | |
| 7,595,985 B2 | 9/2009 | Adducci et al. | |
| 7,697,285 B2 * | 4/2010 | Donowho | H05K 7/20572 165/122 |
| 7,746,637 B2 | 6/2010 | Donowho et al. | |
| 7,764,495 B2 | 7/2010 | Hruby et al. | |
| 7,839,635 B2 | 11/2010 | Donowho et al. | |
| 7,878,888 B2 | 2/2011 | Rasmussen et al. | |
| 7,907,402 B2 | 3/2011 | Caveney | |
| 8,087,979 B2 | 1/2012 | Rasmussen | |
| 8,130,494 B2 | 3/2012 | Larsen et al. | |
| 8,257,155 B2 | 9/2012 | Lewis, II | |
| 8,403,736 B2 | 3/2013 | Rasmussen et al. | |
| 8,405,984 B2 | 3/2013 | Donowho et al. | |

(Continued)

FOREIGN PATENT DOCUMENTS

| | | |
|---|---|---|
| EP | 2252136 A2 | 11/2010 |
| WO | 2016167804 A1 | 10/2016 |

*Primary Examiner* — Steven S Anderson, II
(74) *Attorney, Agent, or Firm* — Christopher S. Clancy; James H. Williams; Aimee E. McVady

(57) ABSTRACT

An electronic equipment rack has a support structure made up of post members configured to form a cage having a front, a back, a top, a bottom, a first lateral side, and a second lateral side and defining a space therebetween. A first plenum is arranged along the first lateral side of the support structure. A second plenum is arranged along the second lateral side of the support structure. A sealing panel defining a first wall of the first plenum has a length extending substantially from the top of the support structure to the bottom of the support structure. A portion of the first sealing member is selectively removable to define an intake port in the first plenum.

18 Claims, 14 Drawing Sheets

(56) References Cited

U.S. PATENT DOCUMENTS

| | | | |
|---|---|---|---|
| 8,490,799 B2 | 7/2013 | Knight et al. | |
| 8,526,181 B2 | 9/2013 | Levesque et al. | |
| 8,526,182 B2 | 9/2013 | Chen et al. | |
| 8,582,292 B1 * | 11/2013 | Eichelberg | H05K 7/20736 |
| | | | 361/679.49 |
| 8,848,367 B2 | 9/2014 | Adducci et al. | |
| 8,867,206 B2 | 10/2014 | Hruby et al. | |
| 8,925,739 B2 | 1/2015 | Crippen et al. | |
| 9,125,326 B1 | 9/2015 | Eichelberg | |
| 9,307,836 B2 | 4/2016 | Arflack et al. | |
| 9,345,172 B2 | 5/2016 | Larsen et al. | |
| 9,420,727 B2 * | 8/2016 | Lewis, II | H05K 5/0004 |
| 9,549,487 B2 | 1/2017 | Lewis, II et al. | |
| 9,795,063 B1 * | 10/2017 | Klein | H05K 7/20745 |
| 2002/0046979 A1 | 4/2002 | Larsen et al. | |
| 2004/0080244 A1 | 4/2004 | Lowther, Jr. et al. | |
| 2005/0168945 A1 | 8/2005 | Coglitore | |
| 2009/0122484 A1 * | 5/2009 | Caveney | H05K 7/20572 |
| | | | 361/692 |
| 2009/0237880 A1 * | 9/2009 | Levesque | H05K 7/20572 |
| | | | 361/692 |
| 2010/0216390 A1 * | 8/2010 | Vaananen | H05K 7/20727 |
| | | | 454/284 |
| 2013/0065501 A1 | 3/2013 | Wang | |
| 2013/0070416 A1 * | 3/2013 | Adducci | H05K 7/20572 |
| | | | 361/694 |
| 2013/0309957 A1 * | 11/2013 | Fleming | H05K 7/20145 |
| | | | 454/184 |
| 2014/0168887 A1 | 6/2014 | Lai et al. | |
| 2015/0147954 A1 | 5/2015 | Marrs et al. | |

* cited by examiner

US 10,524,394 B2

4-POST RACK WITH INTEGRATED INTAKE/EXHAUST REGIONS

TECHNICAL FIELD

The invention relates to a 4-post rack, and more particularly, the invention relates to a 4-post rack having integrated ventilation regions.

BACKGROUND OF THE INVENTION

Current data centers employ thermal management of rack mounted network equipment. The thermal management systems are designed to segregate the hot air of network equipment exhaust from the cool or cold air intake region of the data center, making the cooling system more efficient. This is accomplished by installing intake and exhaust ducts mounted adjacent to rack mounted switches that employ side to side airflow. Previous rack mounted solutions were designed to be mounted behind vertical cable managers installed on each side of the racks. The position of the ducts behind the vertical cable managers effectively blocks any use of pass through features and vertical patch panel mounting provided by the vertical cable managers.

What is required is a solution that allows for intake/exhaust regions to be used in a space between the vertical cable manager and the rack mounted switches. Current 4-post open racks do not provide this space.

SUMMARY OF THE INVENTION

A first aspect of the invention is directed to an electronic equipment rack. The electronic equipment rack comprises a support structure, a first plenum, a second plenum, and a sealing panel. The support structure has a plurality of post members configured to form a cage having a front, a back, a top, a bottom, a first lateral side, and a second lateral side and defining a space therebetween. The first plenum is arranged along the first lateral side of the support structure. Similarly, the second plenum is arranged along the second lateral side of the support structure. The first sealing panel defines a first wall of the first plenum and has a length extending substantially from the top of the support structure to the bottom of the support structure. A portion of the first sealing member is selectively removable to define an intake port in the first plenum.

A second aspect of the invention is also directed to an electronic equipment rack. This electronic equipment rack comprises a support structure, a first plenum, a second plenum, and a plurality of baffles. The support structure has a plurality of post members configured to form a cage having a front, a back, a top, a bottom, a first lateral side, and a second lateral side and defining a space therebetween. The first plenum is arranged along the first lateral side of the support structure, and the second plenum is arranged along the second lateral side of the support structure. A plurality of baffles is located within each plenum. The baffles are adjustable to selectively delimit a first volume of an intake duct associated with the first plenum and a second volume of an exhaust duct associated with the second plenum. The arrangement of the baffles established an air flow path from the intake duct to the exhaust duct across an electronic equipment supported within the cage.

A third aspect of the invention is also directed to an electronic equipment rack. The electronic equipment rack comprises a support structure, an intake duct, an exhaust duct, and a baffle arrangement. The support structure comprises a plurality of post members configured to form a cage having a front, a back, a top, a bottom, a first lateral side, and a second lateral side and defining a space therebetween. The intake duct is located along the first lateral side and is in fluid communication with the space. The exhaust duct is located on the second lateral side and is in fluid communication with the intake port via the space. The baffle arrangement is configured to isolate a hot side of the space associated with one of the front or back of the support structure from a cool side of the space associated with the other of the front or back of the support structure. This creates a thermal barrier within the space to promote a temperature differential within the space. A first volume of the space exhibits a first temperature which is lower than a second temperature exhibited by a second volume of the space. A portion of a boundary between the hot side and the cool side is substantially defined by a panel of an electronic equipment supported within the space by the support structure.

Other features and advantages of the invention will be apparent from the following specification taken in conjunction with the following drawings.

BRIEF DESCRIPTION OF THE DRAWINGS

To understand the present invention, it will now be described by way of example, with reference to the accompanying drawings in which.

DETAILED DESCRIPTION

The present invention is a modification to existing 4-post racks. The assembly consists of side weldments of the rack using extended horizontal top and bottom brackets to create an open area between electronic equipment mount posts or rails and an outer side surface of the rack. Vertical posts or channels at each corner and front to back brackets complete the assembly of a new, wider 4-post rack. The additional vertical posts or channels at each corner of the rack include mount slots at 1 rack unit spacing for the installation of baffles or shelves which act as the top and bottom surfaces of intake and exhaust ducts. End panels installed to each side of the rack act as the outer surfaces of intake and exhaust regions.

Figure 1:
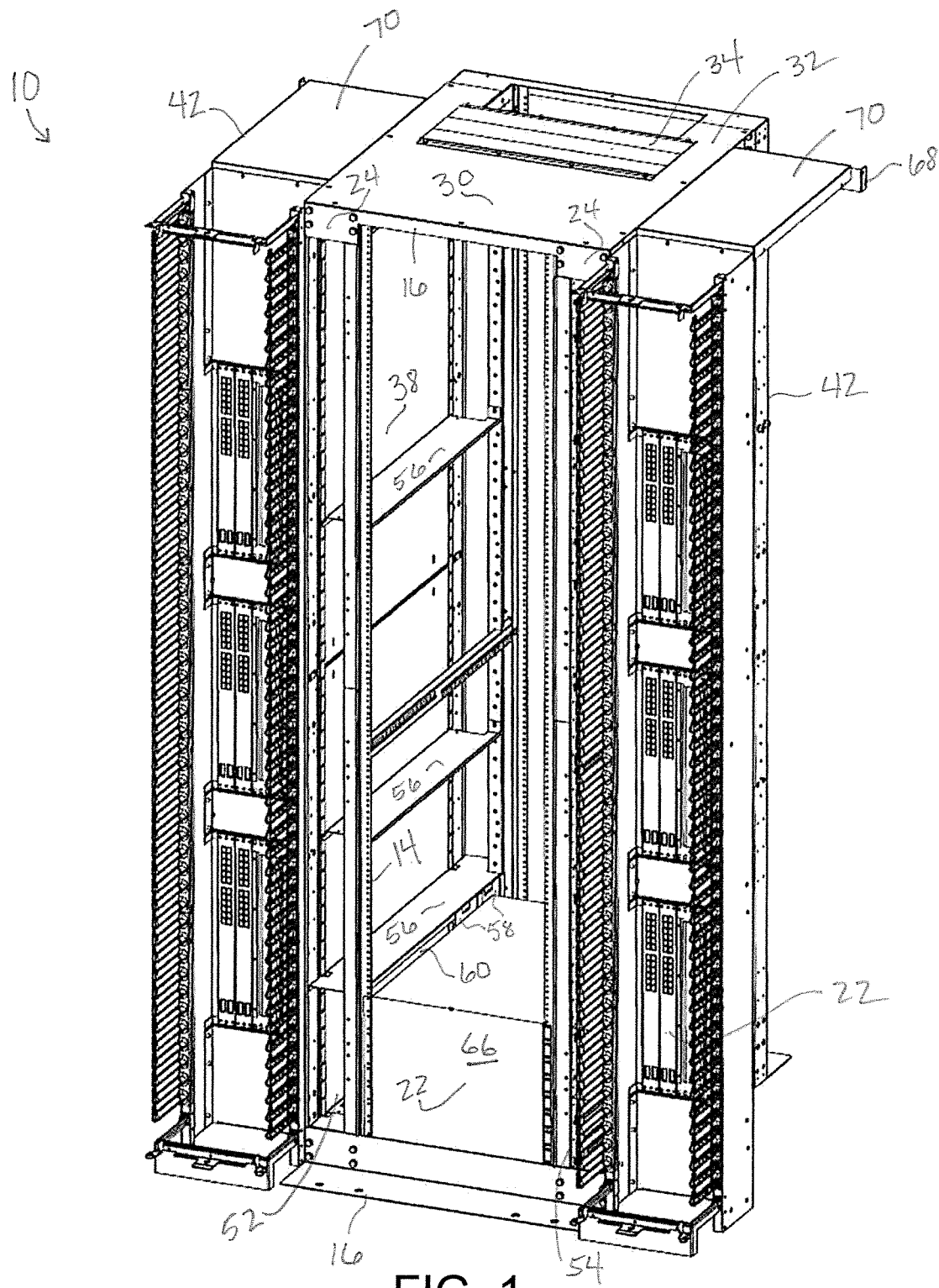
FIG. 1 is a front perspective view of a 4-post rack having integrated intake/exhaust ducts along opposing sides of the rack and a PEVF vertical cable manager with mounted vertical equipment installed.
Figure 2:
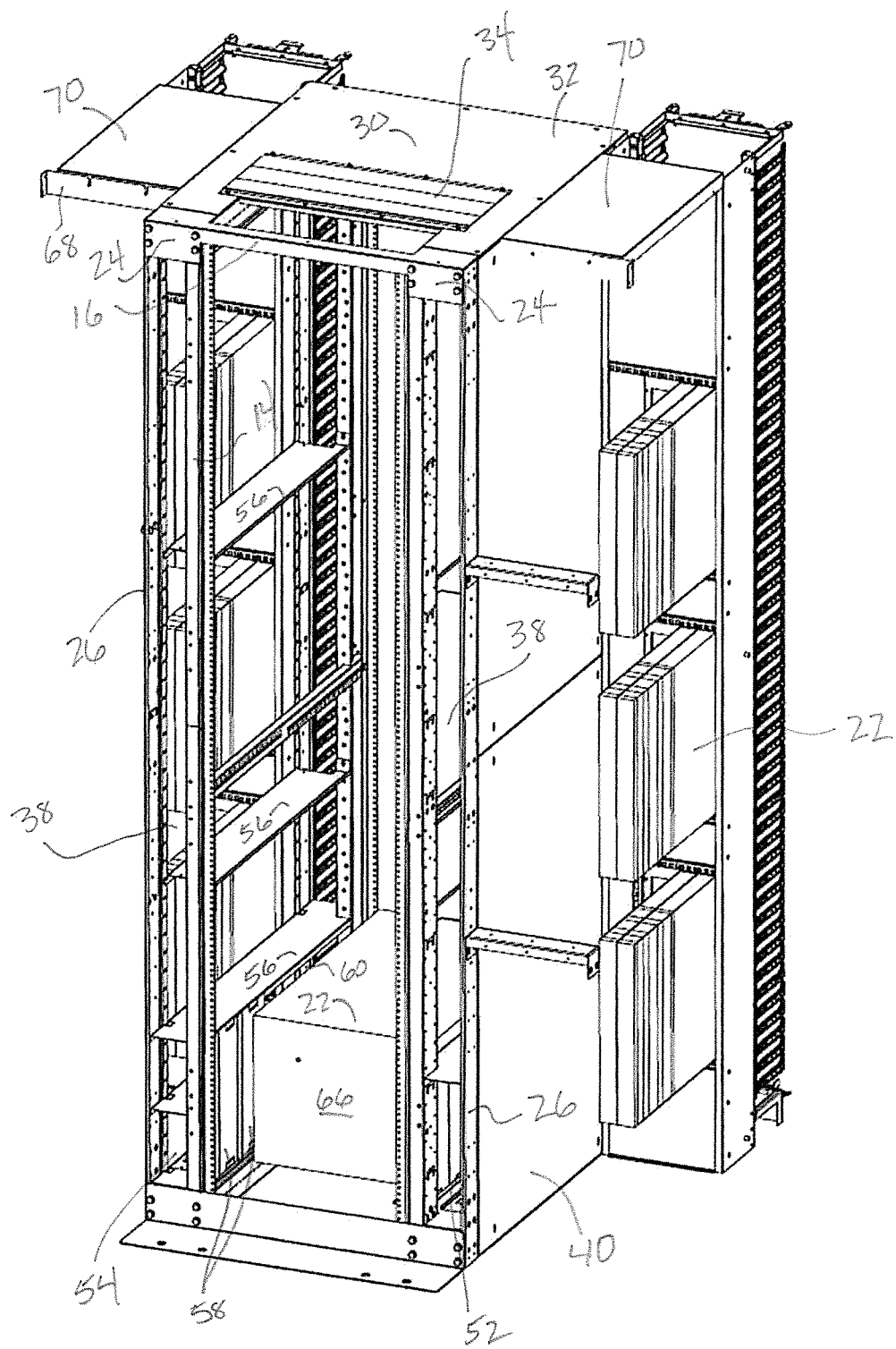
FIG. 2 is a rear perspective view of the 4-post rack of FIG. 1.
Figure 3:
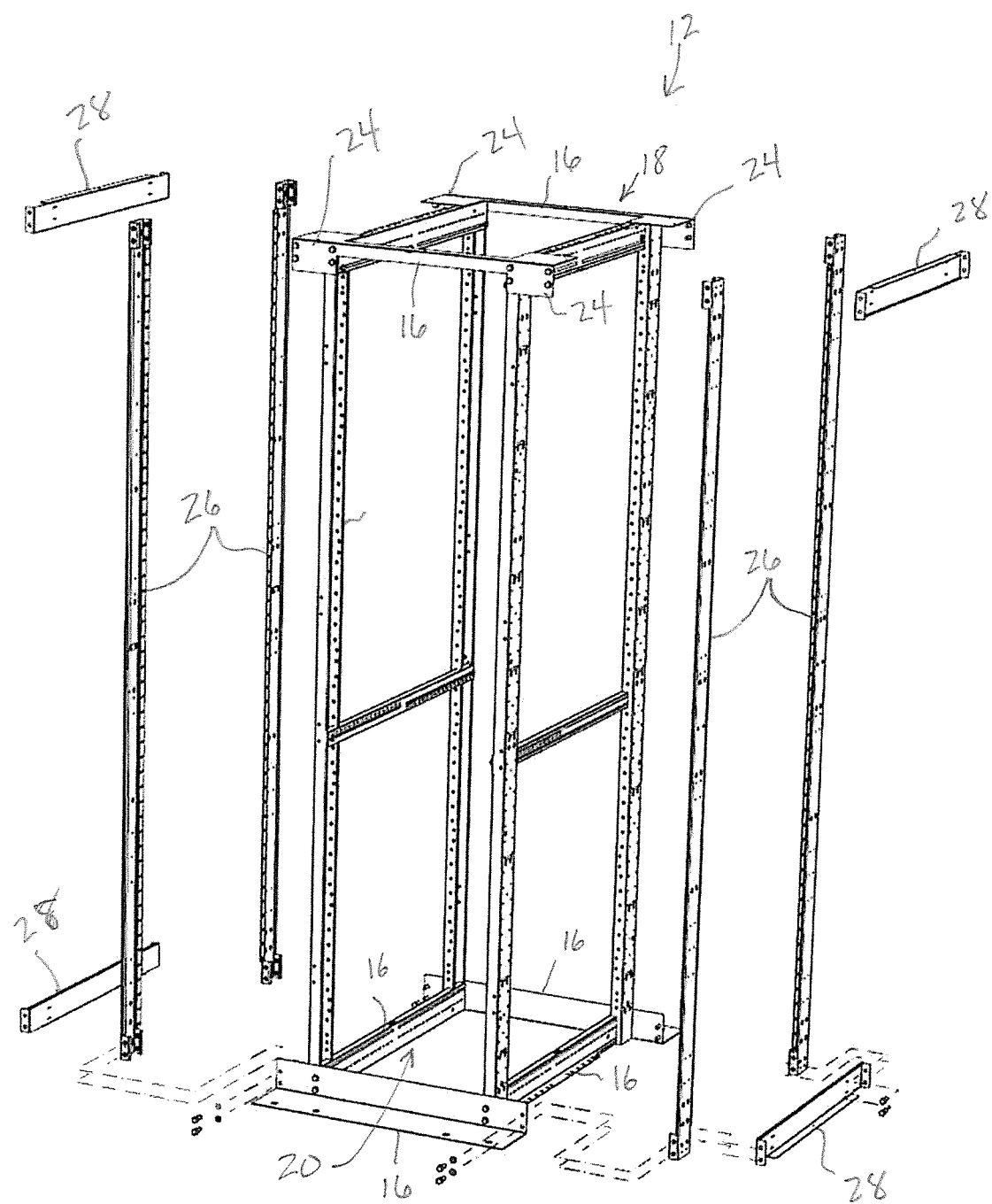
FIG. 3 is an exploded front perspective view of a 4-post rack having integrated intake/exhaust ducts along opposing sides of the rack.
Figure 4:
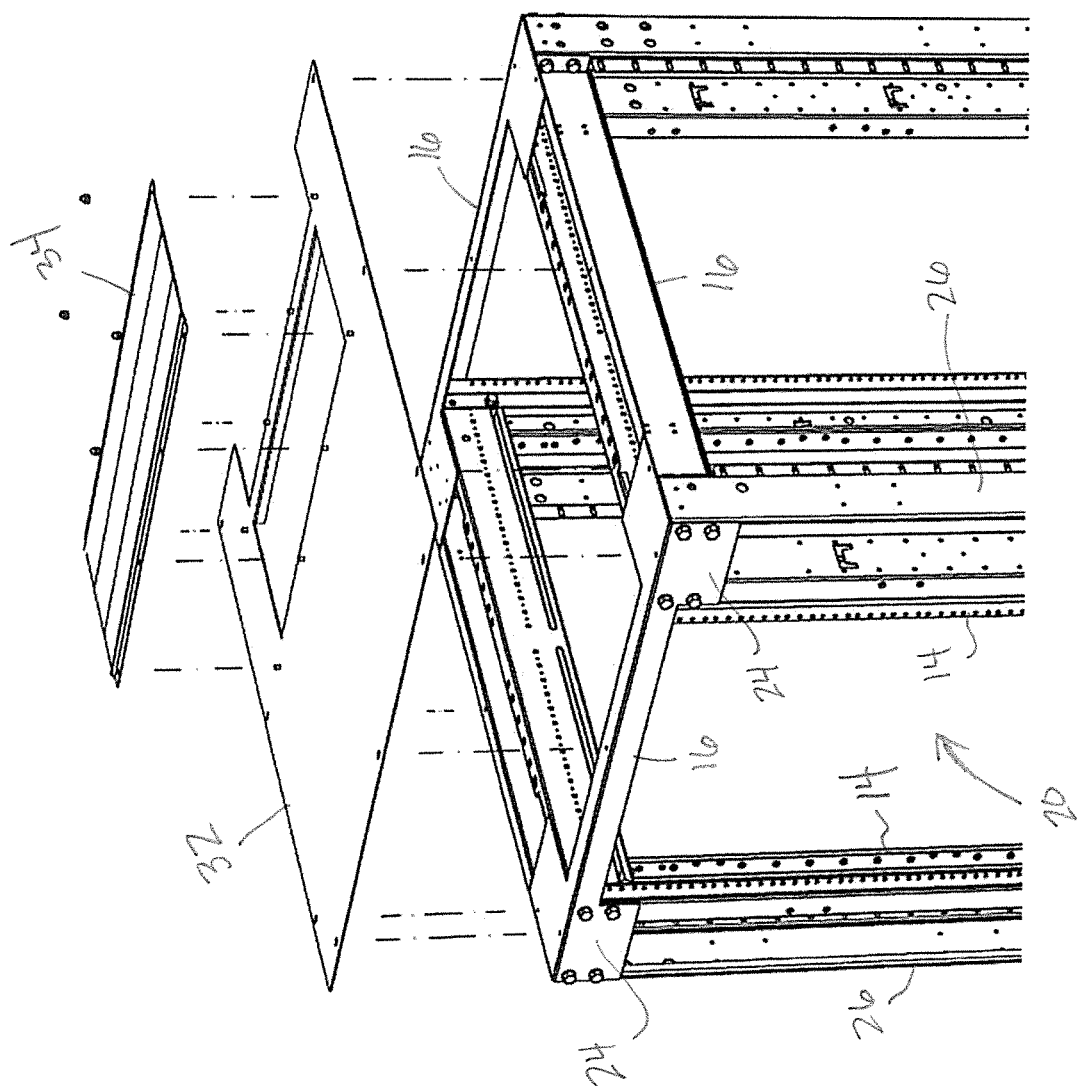
FIG. 4 is an exploded partial view of an upper portion of a 4-post rack showing a rack top panel assembly.
Figure 5:
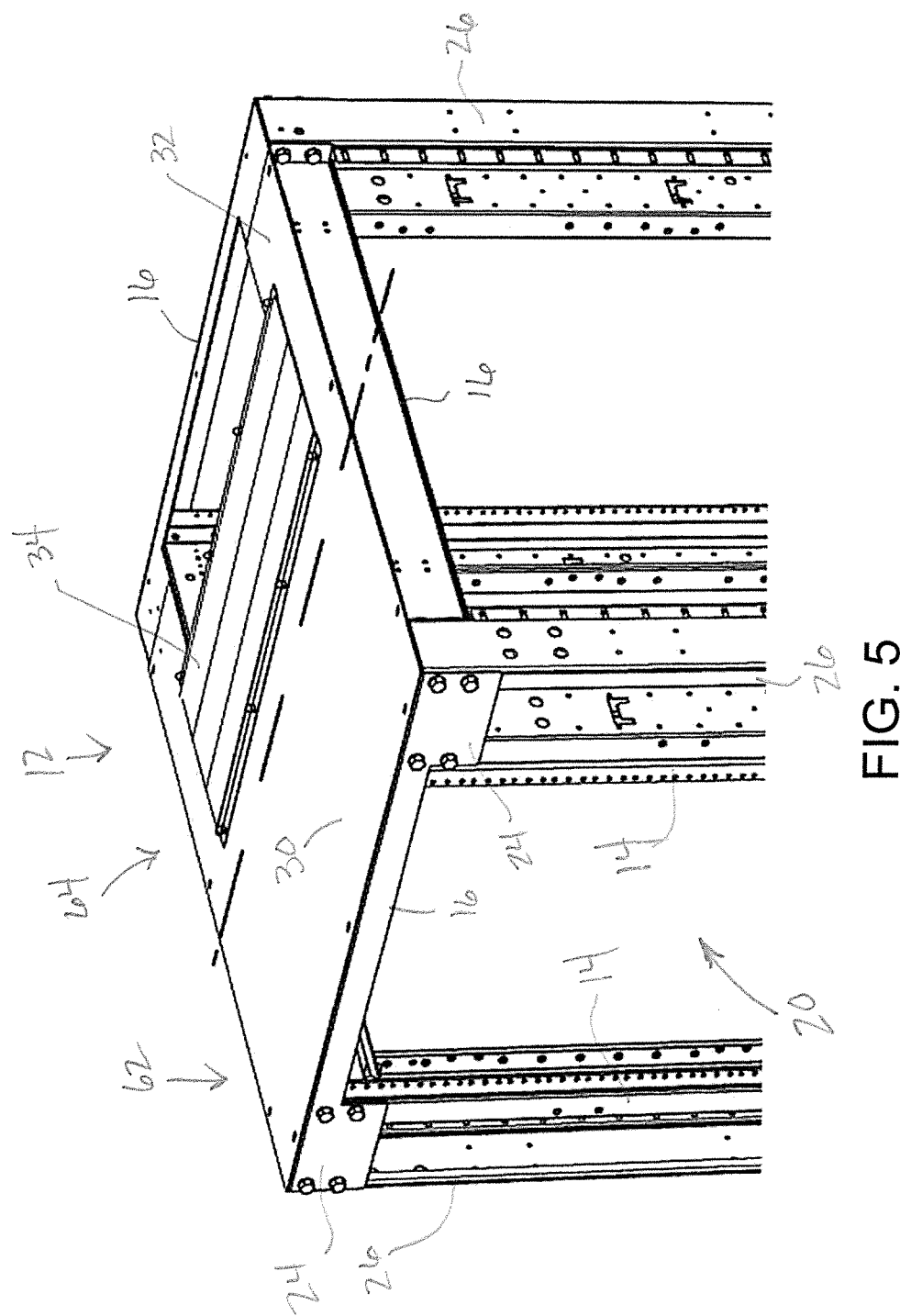
FIG. 5 is a partial view of an upper portion of a 4-post rack.
Figure 6:
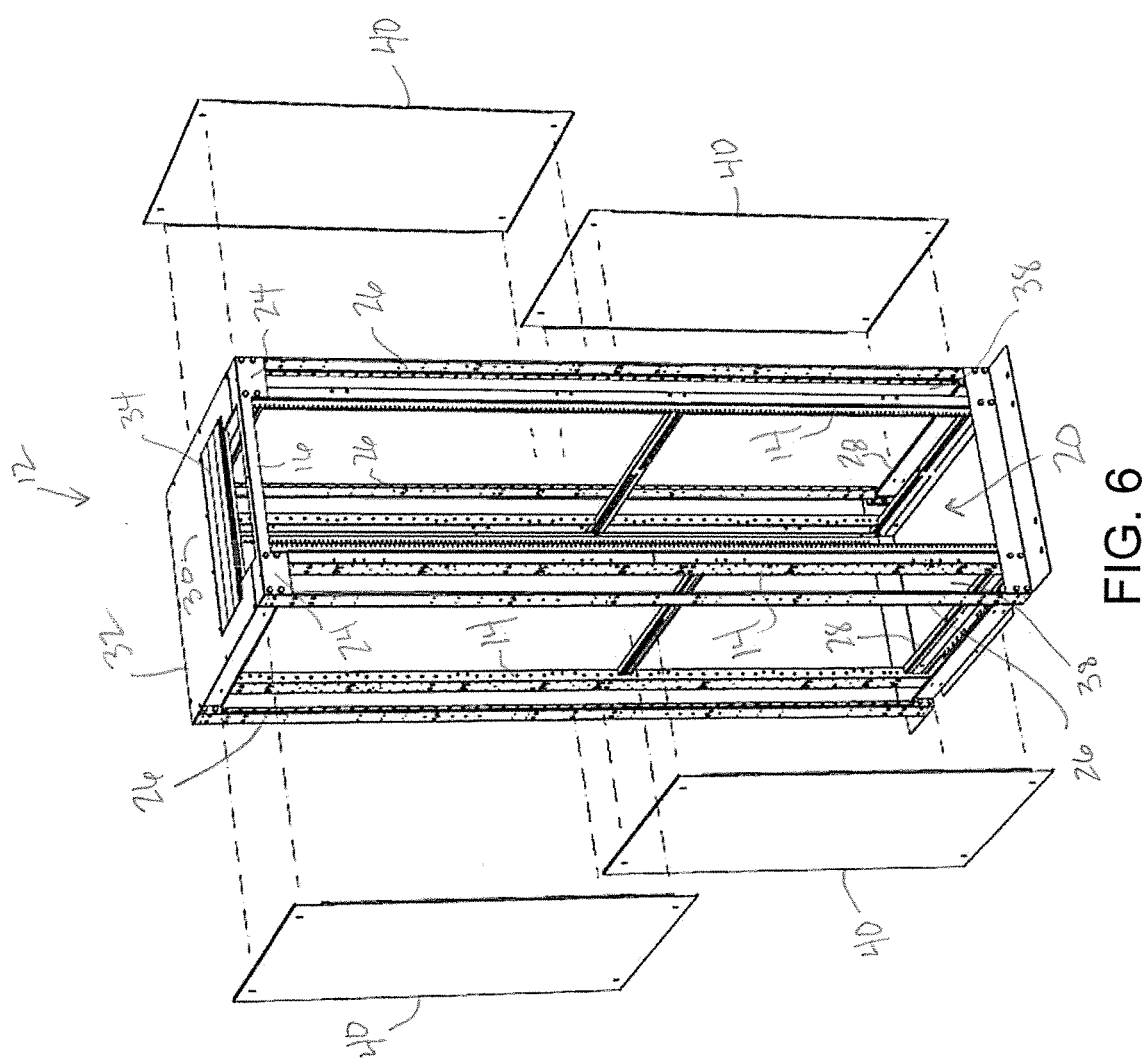
FIG. 6 is a front perspective view showing exploded end panels comprising a top wall and a bottom wall which attach to rack vertical channels.
Figure 7:
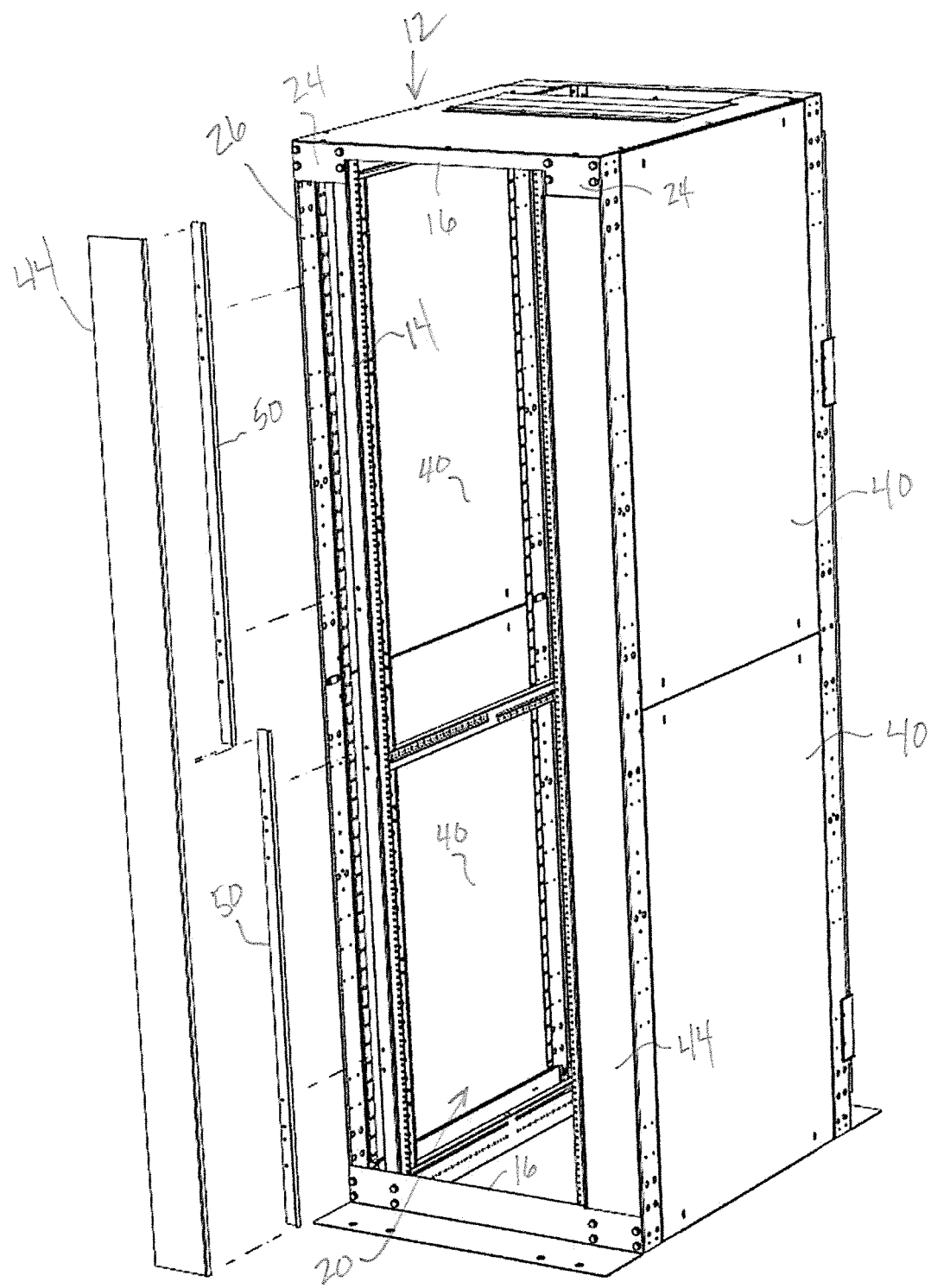
FIG. 7 is a front perspective view showing a flap seal installation.
Figure 8:
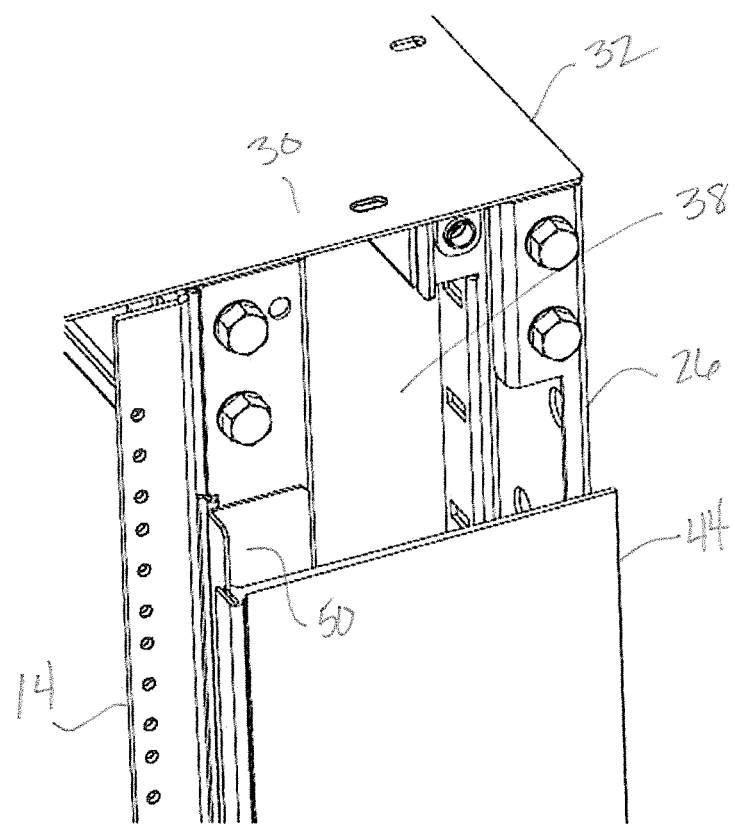
FIG. 8 is a magnified portion of FIG. 7.
Figure 9:
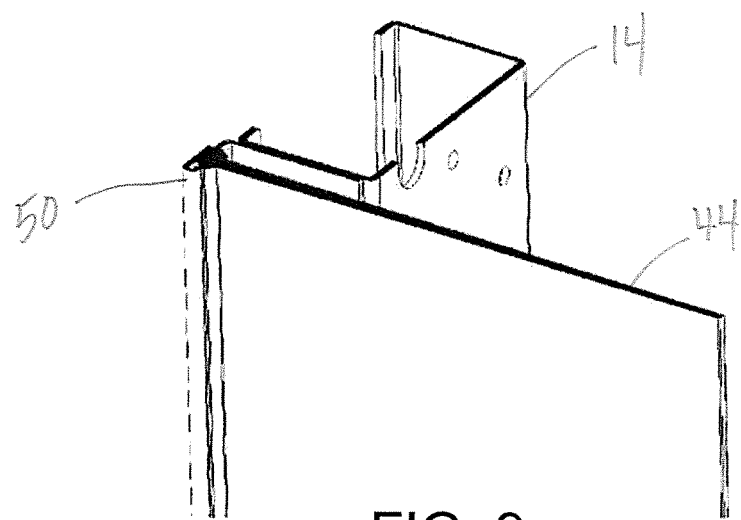
FIG. 9 is a magnified view of a seal flap bracket attachment to the rack.

The new 4-post rack assembly is shown in FIGS. 1 and 2, configured with two (2) PEVF vertical cable managers having electronic switches and patch panels installed, a side air flow rack mounted network switch, and intake/exhaust regions formed adjacent the switch.

Modifications to an existing 4-post rack assembly are shown in FIGS. 3 through 9.

The new intake/exhaust ducts are shown in FIGS. 10 through 14. These ducts can be installed on either side of the rack and can be used as an intake or exhaust. They are preferably identical.

Figure 15:
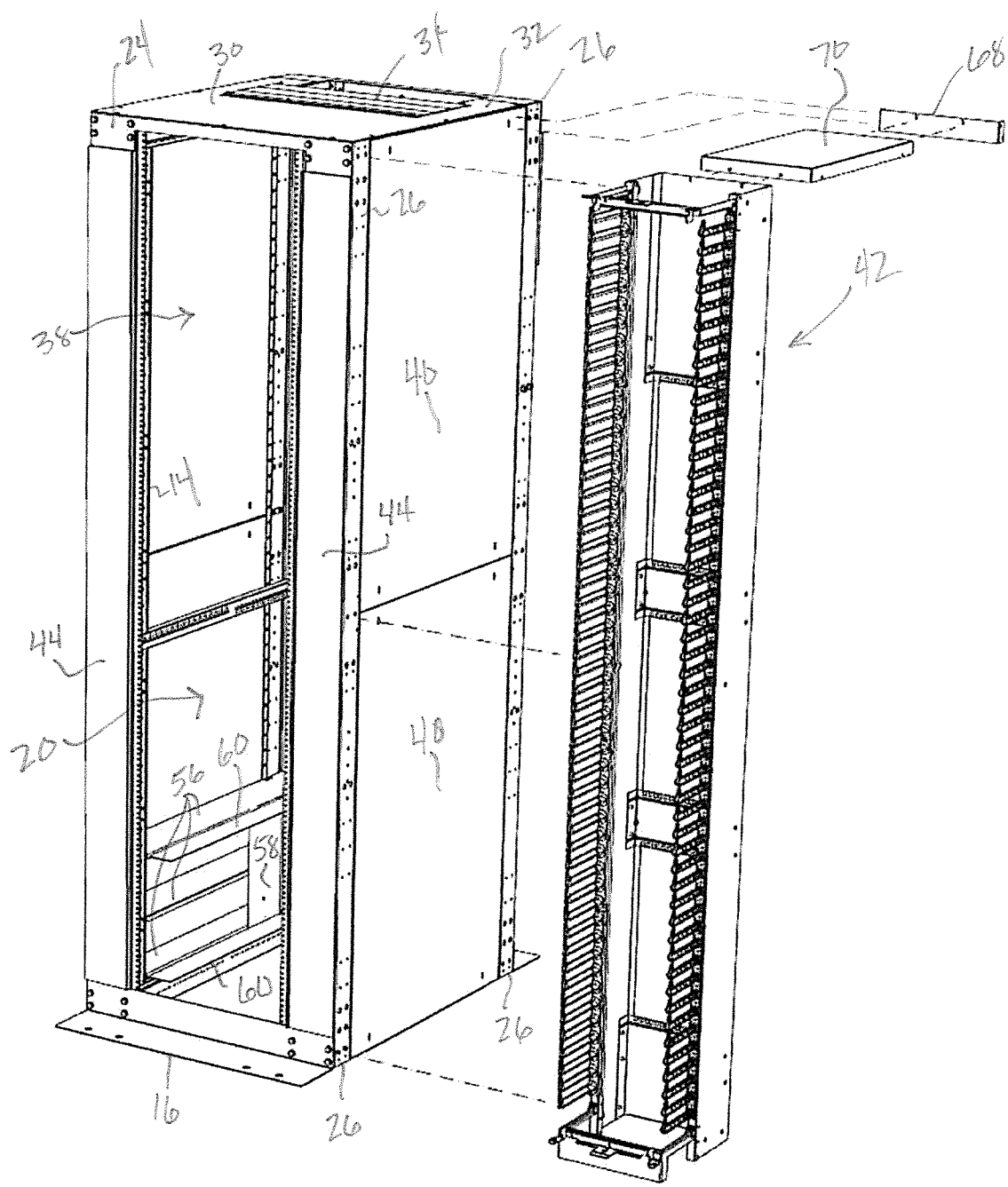
FIG. 15 is an exploded perspective view showing a PRVF vertical cable manager assembly with pass through holes removed to maintain hot/cold side thermal separation.

Installation of a vertical cable manager 42 is shown in FIG. 15.

Figure 16:
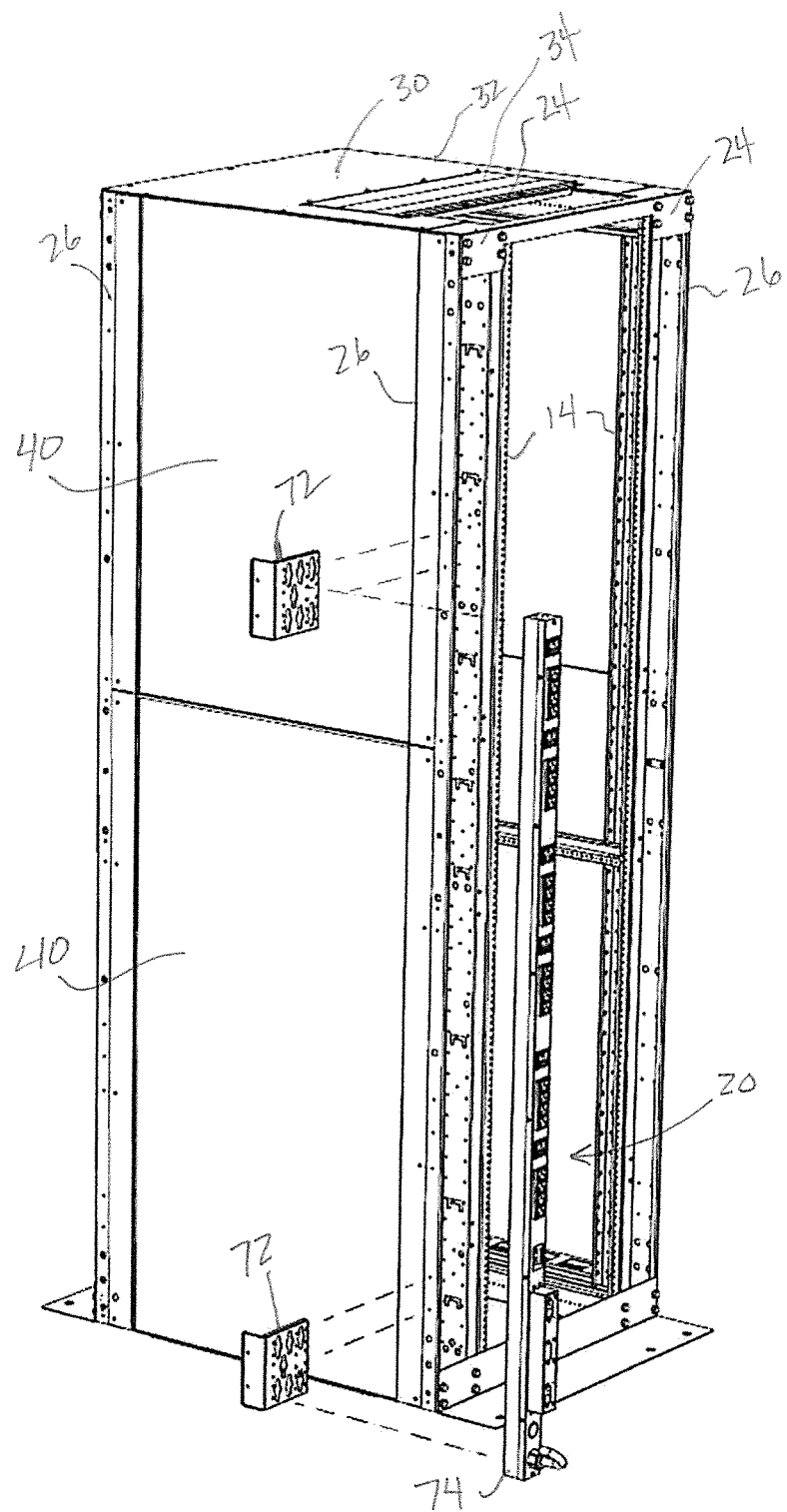
FIG. 16 is a perspective view of an embodiment of the invention including power distribution units.

Installation of a new power distribution unit mount bracket is shown in FIG. 16.

Again, the present invention is a modification to 4-post electronic equipment racks. An electronic equipment rack 10 includes a typical support structure 12 (see FIG. 3) made up of four spaced vertical posts 14 joined by 8 horizontal posts 16 to form a cage 18 having a cuboid shape defining a space 20 where one or more pieces of electronic equipment 22 can be supported. Front and rear, upper and lower horizontal posts 16 include outwardly flared flanges 24 such that each corner of the cuboid cage 18 has a laterally extending bracket to which four additional vertical posts 26 are attached. These additional posts 26 can be joined by further horizontal posts 28 as needed to provide sufficient rigidity to the rack 10. The posts of various orientations are attached to each other by fasteners known in the art such as suitable mechanical fasteners and welds. Alternatively, the posts can be roll formed wherein horizontal and vertical posts are integral with one another in a unibody form.

A top 30 of the rack 10 is at least partially enclosed by a panel 32. The panel 32 is fastened to horizontal posts 16 at the upper end of the rack 10. The panel 32 includes a brush entry 34 that can be rotated 180° to position the brush entry 34 towards the front or rear of the rack 10 as required. The brush entry 34 maintains a seal with the rack 10 for thermal containment.

The four additional vertical posts 26 are positioned at each corner of the rack 10 and contain mount slots 36 (FIG. 11) at 1 rack unit spacing for the installation of shelves which act as top and bottom baffles within intake and exhaust ducts as will be described in more detail below.

The arrangement of the additional four vertical posts, in which the posts are located laterally outwardly from the space 20, create lateral open areas or plenums 38 (FIG. 6) along the lateral sides of the support structure 12. These plenums 38 extend from the front to the rear and from the top to the bottom of the support structure 12. The laterally placed plenums 38 result in a wider 4-post rack 10.

Each plenum 38 has an enclosed lateral sidewall 40 extending from the front to the rear and from the top to the bottom of the rack 10. The sidewalls 40 are generally produced from a sheet material, typically rigid, and may be produced in sections or panels as shown. Edges of the sidewalls 40 are attached to the four additional vertical posts 26 and upper and lower horizontal posts 28 that join front posts to rear posts. As shown, the top and bottom sidewall panels 40 attach to the additional four posts using fasteners, for example machine screws. The sidewall panels 40 form laterally outer walls of the plenums 38. A vertical cable manager 42 can be installed to the rack 10 assembly as depicted in, for example, FIGS. 1 and 2.

The front and back walls of the plenums 38 are enclosed by similar or identical sealing panels 44. Portions of the sealing panels 44 are selectively removable to define one or more intake ports 46 (FIG. 12) on one lateral side of the rack 10 and one or more exhaust ports 48 on the opposing lateral side of the rack 10. Corresponding intake and exhaust ports 48 are preferably created on the front and back walls of the plenums 38 to allow maximum airflow from both front and back directions.

In one embodiment, the sealing panels 44 are produced from a pliable material, for example a natural or synthetic rubber. Here, the sealing panels 44 are rubber flaps installed on each side of the rack 10 to close front and back walls of the plenums. These flap seals maintain a separation of hot and cool sides of the rack 10. The rubber flap seals are cut and removed from the rack 10 at the positions where intake ports 46 and exhaust ports 48 are desired, for example on opposing sides of an electronic equipment 22 supported within the space 20 by the support structure 12.

Brackets 50 are provided to attach at least one edge of the sealing panels 44 to the rack 10 and over the plenums 38. One lengthwise edge of the sealing panels 44 may remain free from attachment in sealing engagement with a post.

The rack 10 includes a plurality of baffles within each plenum 38. The baffles are adjustable to selectively delimit a volume of an intake duct 52 associated with a first plenum 38 and a volume of an exhaust duct 54 associated with a second plenum 38 on the opposite lateral side of the rack 10 from the first plenum 38. The plurality of baffles includes cross baffles 56 and upright baffles 58.

The cross baffles 56 are generally oriented horizontally within the plenums 38 to delimit a height of the intake and exhaust ducts 52, 54. A distance from an upper cross baffle 56 to a lower cross baffle 56 defines the upper and lower limits of the intake and exhaust ducts 52, 54 of the rack 10.

Figure 10:
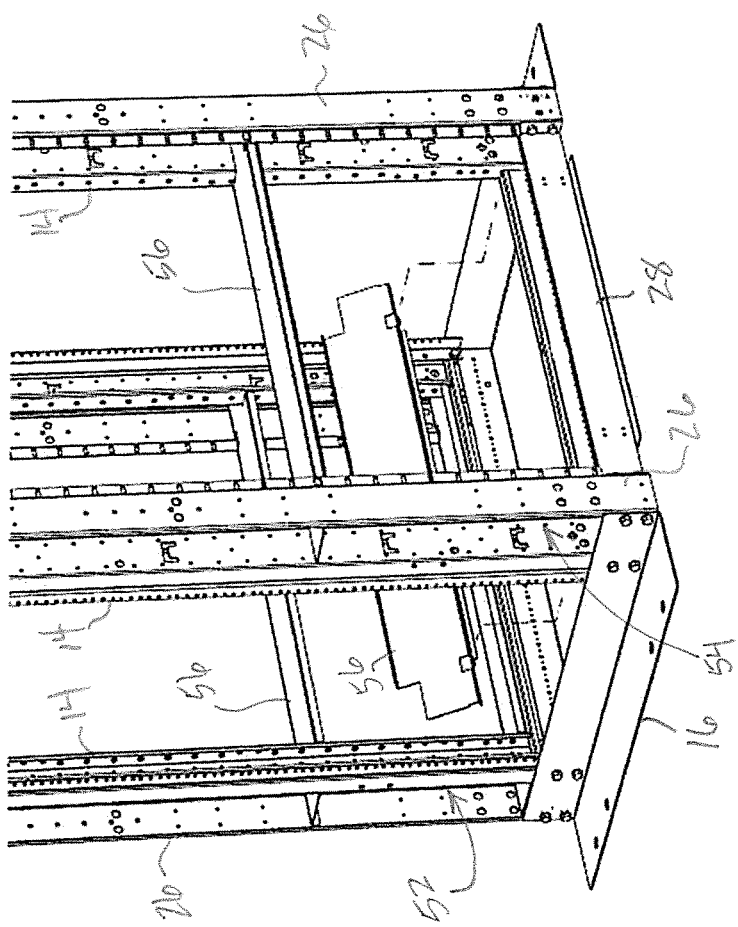
FIG. 10 is a partial perspective view showing a lower segment of the rack and shelving used to define upper and lower intake/exhaust regions.
Figure 11:
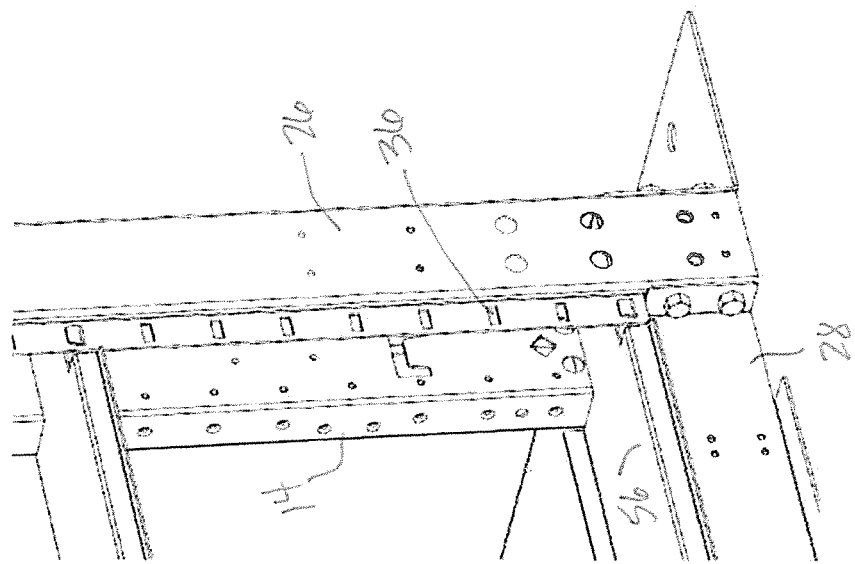
FIG. 11 is a partial perspective view showing a rack vertical channel having rectangular cutouts at 1 rack unit spacing to position the top and bottom shelves at the desired rack location in the rack.

The cross baffles 56 take a similar structure to that of a shelf within each plenum. The cross baffles 56 include formed tabs at each end which allow the cross baffles 56 to be clipped in place to the rack 10 vertical posts 14 as shown in FIGS. 10-11. The rack 10 posts have rectangular cutouts at 1 rack unit spacing to position upper and lower cross baffles 56 at a required rack location in the rack 10 to selectively define the height of the duct. In FIG. 11, an upper cross baffle 56 is positioned eight rack units (14 ins.) above a lower cross baffle 56.

Figure 12:
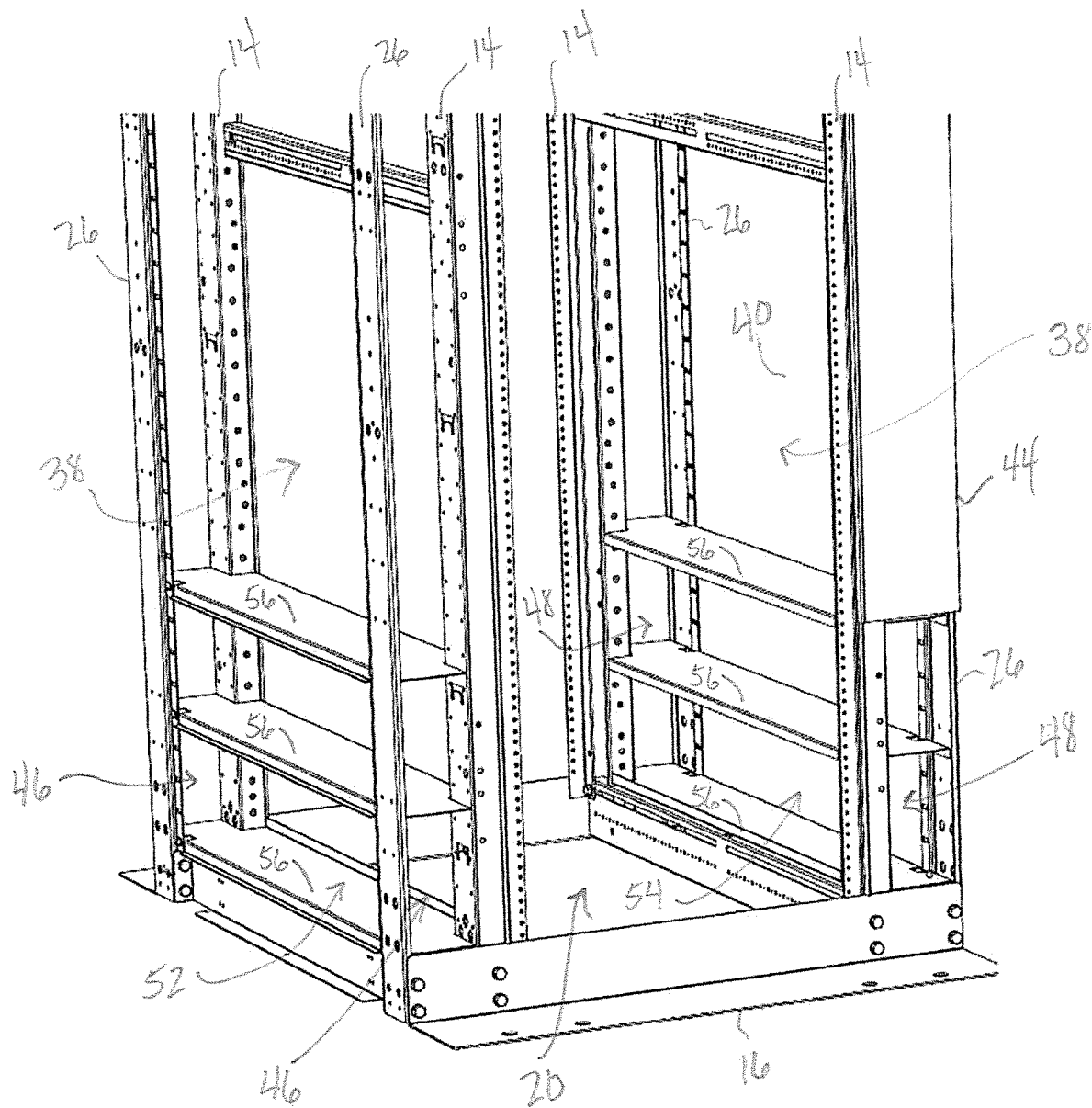
FIG. 12 is a partial perspective view showing a second shelf installed between upper and lower shelves at a desired height from the lower shelf to accommodate or match an installed network switch.

As shown in FIG. 12, a bottom cross baffle 56 is clipped in place at a 1 rack unit position. This establishes a lower limit of the duct. A top cross baffle 56 is installed and is adjusted to match the desired height of the duct. Typically, the upper cross baffle 56 will correspond to the uppermost edge corner of the electronic equipment 22 housing, and the lower cross baffle 56 will correspond to the lowermost edge corner of the electronic equipment 22 housing parallel to the uppermost edge corner.

Figure 14:
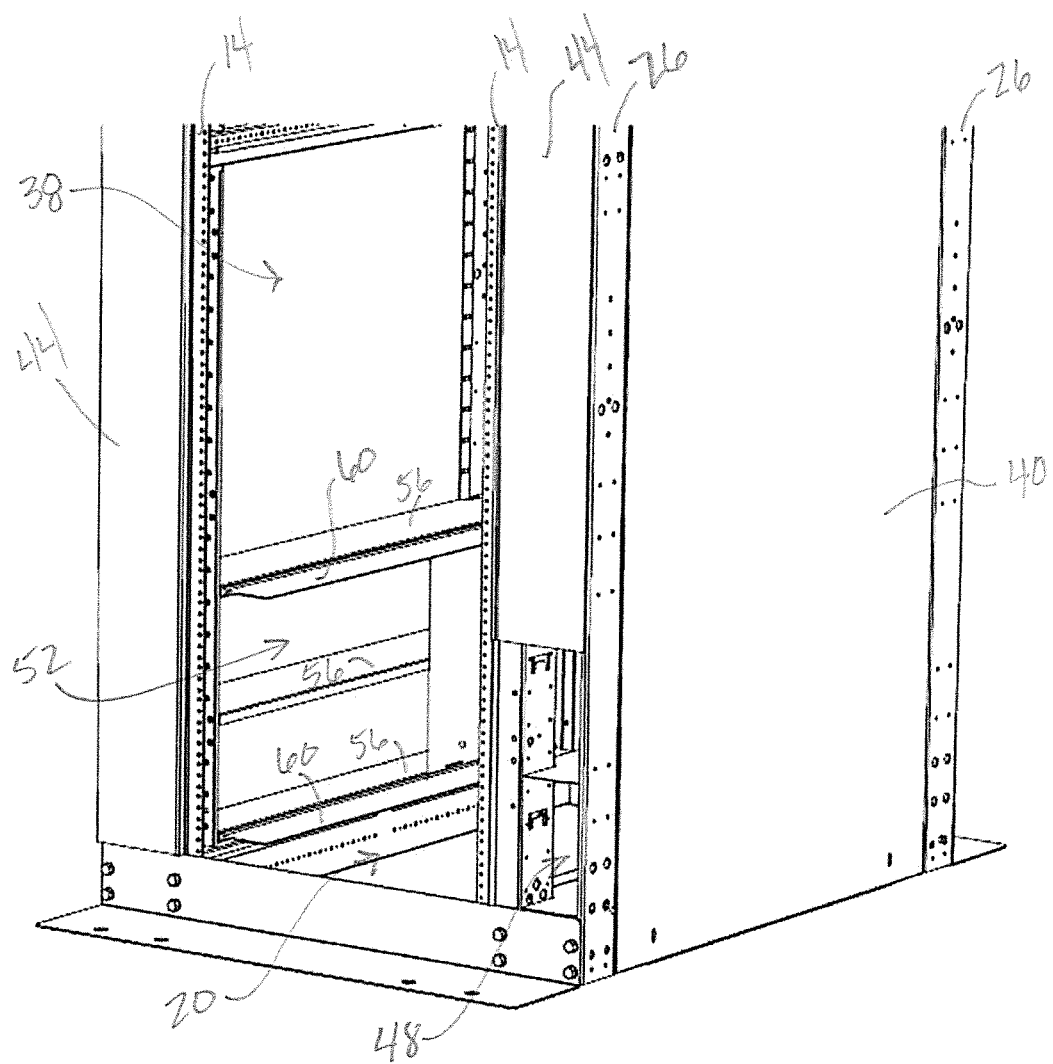
FIG. 14 is a partial perspective view showing flap seals installed to shelf flanges to form a seal against a rack mounted network switch (not shown for clarity)

As shown in FIG. 14, the cross baffles 56 are outfitted with electronic equipment seals 60 which extend inwardly into the space 20 from edges of the cross baffles 56. These equipment seals 60 are generally flap seals attached to flanges on the cross baffles 56 to form a seal against the rack 10 mounted electronic equipment 22. Thus, the electronic equipment seals 60 are configured to engage an electronic equipment 22 supported within the space 20 by the support structure 12.

Figure 13:
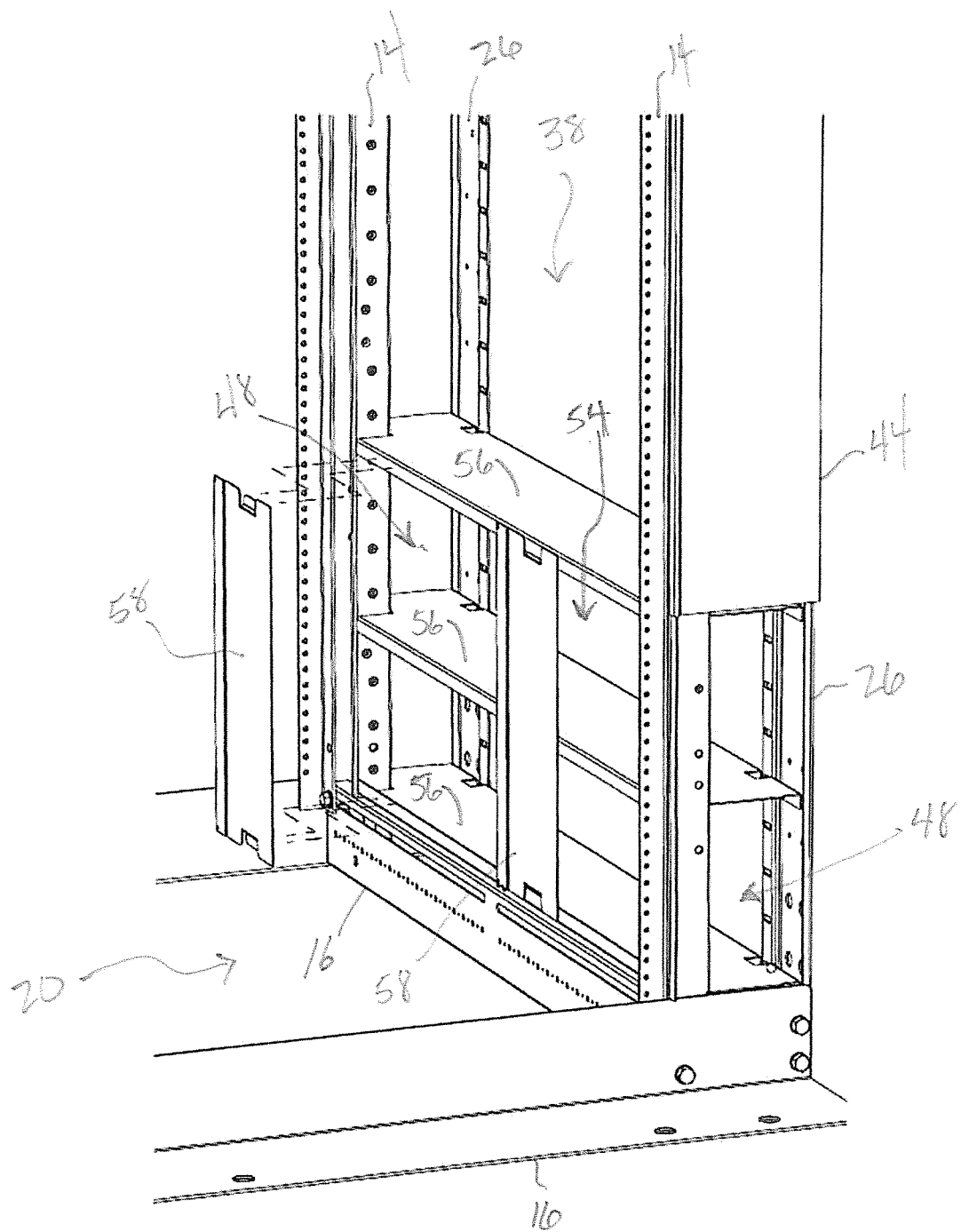
FIG. 13 is a partial perspective view showing side baffle plates installed to at least substantially match a depth of a network switch.

As shown in FIG. 13, upright baffles 58 or side baffles further delimit the volume of the intake and exhaust ducts 52, 54. The upright baffles 58 delimit widths of the intake and exhaust ducts 52, 54. More particularly, the upright baffles 58 are attached to and extend from the upper cross baffle 56 to the lower cross baffle 56 and close interior sidewalls of the intake and exhaust ducts 52, 54 relative to the space 20. Typically, these upright baffles 58 have a length/height of 8 rack units. The upright baffles 58 are positioned to match the depth of the electronic equipment 22 as it is mounted within the space 20. This creates a thermal barrier between the intake/exhaust ducts 52, 54 and a volume behind the electronic equipment 22 through which cables can be run to and from the electronic equipment 22. Thus, the cabling is isolated from a hot zone of the rack 10.

For example, an arrangement of baffles creates an air flow path in which a flow of air enters the first plenum 38 via the intake port or ports 46 and across the space 20 to the exhaust port or ports 48 in the second plenum. The baffle arrangement includes a plurality of baffles located within the first plenum 38 and the second plenum 38 which are adjustable to selectively delimit a first volume of an intake duct 52 associated with the first plenum 38 and delimit a second volume of an exhaust duct 54 within the second plenum 38. An electronic equipment 22 supported within the space 20 by the support structure 12 provides a fluid communication between the intake duct 52 and the exhaust duct 54. The arrangement of the plurality of baffles creates a thermal barrier between a volume of the rack 10 delimited by the plurality of baffles and at least one of a front or rear portion of the electronic equipment 22 supported in the space 20 between the intake duct 52 and the exhaust duct 54.

Further, the arrangement of baffles is configured to isolate a hot side 62 of the space 20 associated with one of the front or back of the support structure 12 from a cool side 64 of the space 20 associated with the other of the front or back of the support structure 12 by creating a thermal barrier within the space 20. This promotes a temperature differential within the space 20 wherein a first volume of the space 20 within the cool side 64 exhibits a first temperature which is lower than a second temperature exhibited by a second volume of the space 20 on the hot side 62 in which the electronic equipment 22 is mounted. Thus, a portion of a boundary between the hot side 62 and the cool side 64 is substantially defined a front or back panel 66 of the electronic equipment 22 supported within the space 20 by the support structure 12.

As show in FIG. 13, an intermediate cross baffle 56 can be inserted between the upper cross baffle 56 and the lower cross baffle 56 when the electronic equipment 22 has a height less than 8 rack units.

One of ordinary skill in the art would readily understand that the rack 10 can have multiple intake and exhaust ducts 52,54 as needed by simply removing further portions of the sealing panels 44 and providing additional cross baffles 56 and upright baffles 58 in the manner described above. In other words, the person of ordinary skill in the art would merely repeat the structures thus far described at different rack heights to produce the same result.

In an embodiment of the invention illustrated in FIGS. 1 and 15, a vertical cable manager 42 is attached to the outer lateral sides 40 of the plenums 38. Weld nuts are supplied on the inside of the rack vertical posts 26 to allow mounting of the vertical cable manager 42 at three locations. This allows for the attachment of the vertical cable manager 42 without requiring access to the intake and exhaust ducts 52,54 of the rack 10. A vertical cable manager cover mount bracket 68 is fastened a cover 70 to the rack assembly front to back post. Pass through holes can be removed to maintain hot/cool side thermal separation.

In an embodiment of the invention illustrated in FIG. 16, the rack 10 includes power distribution unit mount brackets 72. These brackets 72 are secured to the rack vertical posts 14 and wrap around to the back of the rack 10. The brackets 72 are installed on the intake side of the rack 10 as to not interfere with the exhaust ducts 54. One or more power distribution units 74 are mounted to the brackets 72 through keyholes on the mount brackets 72. Mount holes at multiple locations on the rack vertical post allow for the installation of various size power distribution units 74.

While the specific embodiments have been illustrated and described, numerous modifications come to mind without significantly departing from the spirit of the invention, and the scope of protection is only limited by the scope of the accompanying Claims.

What is claimed is:

1. An electronic equipment rack comprising:
    a support structure comprising a plurality of posts forming a cage having a front, a back, a top, a bottom, a first lateral side, and a second lateral side and defining a space therebetween;
    a first plenum arranged along the first lateral side of the support structure, wherein the first plenum is a first open area along the first lateral side of the support structure;
    a second plenum arranged along the second lateral side of the support structure, wherein the second plenum is a second open area along the second lateral side of the support structure;
    a first sealing panel defining a first front wall of the first plenum;
    an intake port, wherein the intake port extends from a bottom of the first sealing panel to the bottom of the support structure, and the first sealing panel extends from the too of the support structure to a top of the intake port;
    a second sealing panel defining a second front wall of the second plenum; and
    an exhaust port, wherein the exhaust port extends from a bottom of the second sealing panel to the bottom of the support structure, and the second sealing panel extends from the top of the support structure to a top of the exhaust port.

2. The electronic equipment rack of claim 1 further comprising:
    a plurality of baffles located within the first plenum, wherein the baffles of the plurality of baffles are adjustable to selectively delimit a first volume of an intake duct, and wherein the first volume is a part of the first plenum.

3. The electronic equipment rack of claim 2 further comprising:
a first adjustable cross baffle delimiting a height of the intake duct in fluid communication with the intake port.

4. The electronic equipment rack of claim 3 further comprising:
a first electrical equipment seal extending into the space from an edge of the first cross baffle and configured to engage electronic equipment supported within the space by the support structure.

5. The electronic equipment rack of claim 4 further comprising:
a second adjustable cross baffle further delimiting the height of the intake duct.

6. The electronic equipment rack of claim 5 further comprising:
a first adjustable upright baffle in the first plenum delimiting a width of the intake duct.

7. The electronic equipment rack of claim 6 further comprising:
a second electrical equipment seal extending into the space from an edge of the second cross baffle and configured to engage the electronic equipment supported within the space by the support structure.

8. The electronic equipment rack of claim 1 further comprising:
a third sealing panel defining a rear wall of the first plenum and positioned opposite the first sealing panel;
a rear intake port, wherein the rear intake ort extends from a bottom of the third scaling panel to the bottom of the support structure and is opposite the intake port formed in the first sealing panel; and
a fourth sealing panel defining a rear wall of the second plenum and positioned opposite the second sealing panel; and
a rear exhaust port, wherein the rear exhaust port extends from a bottom of the fourth sealing panel to the bottom of the support structure and is opposite the exhaust port formed in the second sealing panel.

9. The electronic equipment rack of claim 8 further comprising:
a pair of opposing sidewalls of a sheet material wherein a first sidewall joins the front of the support structure to the rear of the support structure such that the first plenum is formed between the first sidewall of the support structure and the space and between the top of the support structure and the bottom of the support structure, and a second sidewall joins the front of the support structure to the rear of the support structure such that the second plenum is formed between the second sidewall of the support structure and the space and between the top of the support structure and the bottom of the support structure.

10. The electronic equipment rack of claim 9 further comprising:
a top panel of a sheet material at least partially enclosing the top portion of the electronic equipment rack.

11. The electronic equipment rack of claim 1 further comprising:
a plurality of baffles located within the first plenum and the second plenum; and
an air flow path created by the plurality of baffles in which a flow of air enters the first plenum via the intake port and across the space to an exhaust port in the second plenum,
wherein the baffles of the plurality of baffles are adjustable to selectively delimit a first volume of an intake duct and delimit a second volume of an exhaust duct,
and the first volume is a part of the first plenum and the second volume is a part of the second plenum.

12. The electronic equipment rack of claim 11 wherein the plurality of baffles creates a thermal barrier between a volume of the electronic equipment rack delimited by the plurality of baffles and at least one of a front or rear portion of the electronic equipment supported in the space between the intake duct and the exhaust duct.

13. The electronic equipment rack of claim 1 further comprising:
a vertical cable manager attached to the electronic equipment rack wherein one of the first plenum and the second plenum is located between the vertical cable manager and the space.

14. The electronic equipment rack of claim 1 wherein the first sealing panel forms a seal with portions of the electronic equipment rack along an edge of the first sealing panel.

15. The electronic equipment rack of claim 1 wherein the first sealing panel is a flap having an opposing free edge engaging the electronic equipment rack.

16. The electronic equipment rack of claim 1 wherein a portion of the first sealing panel is severable from the first sealing panel to form the intake port therein.

17. The electronic equipment rack of claim 16 wherein the first sealing panel is produced from a flexible material.

18. The electronic equipment rack of claim 17 wherein the flexible material is a rubber.

* * * * *